(12) United States Patent
Lee et al.

(10) Patent No.: US 8,198,545 B2
(45) Date of Patent: Jun. 12, 2012

(54) PRINTED CIRCUIT BOARD REMOVING BONDING SHEET AROUND SIGNAL TRANSMISSION LINE

(75) Inventors: Yong Goo Lee, Seoul (KR); Kyoung Il Kang, Gyeonggi-do (KR)

(73) Assignee: Gigalane Co. Ltd., Gyeonggi-Do (KR)

( * ) Notice: Subject to any disclaimer, the term of this patent is extended or adjusted under 35 U.S.C. 154(b) by 0 days.

(21) Appl. No.: 12/937,469

(22) PCT Filed: Nov. 21, 2008

(86) PCT No.: PCT/KR2008/006910
§ 371 (c)(1),
(2), (4) Date: Oct. 12, 2010

(87) PCT Pub. No.: WO2009/128598
PCT Pub. Date: Oct. 22, 2009

(65) Prior Publication Data
US 2011/0030995 A1  Feb. 10, 2011

(30) Foreign Application Priority Data

Apr. 18, 2008 (KR) .......... 10-2008-0035949

(51) Int. Cl.
*H05K 1/03* (2006.01)
(52) U.S. Cl. .......... 174/255
(58) Field of Classification Search .......... None
See application file for complete search history.

(56) References Cited

U.S. PATENT DOCUMENTS

| | | | |
|---|---|---|---|
| 6,622,370 B1 * | 9/2003 | Sherman et al. | 29/600 |
| 6,780,493 B2 * | 8/2004 | Noda et al. | 428/209 |
| 7,381,901 B2 * | 6/2008 | Tanaka et al. | 174/254 |
| 7,663,064 B2 * | 2/2010 | Dutta et al. | 174/261 |
| 2003/0116343 A1 | 6/2003 | Adachi et al. | 174/254 |
| 2007/0235213 A1 | 10/2007 | Lee et al. | 174/255 |
| 2008/0197938 A1 * | 8/2008 | Hussain et al. | 333/116 |

FOREIGN PATENT DOCUMENTS

| | | |
|---|---|---|
| JP | 2001-144452 | 5/2001 |
| JP | 2007-096159 | 4/2007 |
| KR | 10-2000-0009636 | 2/2000 |
| KR | 10-2003-0047829 | 6/2003 |
| KR | 10-0762395 | 10/2007 |
| WO | WO 2009/102108 | 8/2009 |

OTHER PUBLICATIONS

International Search Report in PCT/KR2008/006910 dated Jun. 16, 2009.

* cited by examiner

*Primary Examiner* — Ishwarbhai Patel
(74) *Attorney, Agent, or Firm* — Harness, Dickey & Pierce, P.L.C.; Anthony G. Fussner; Kisuk Lee

(57) ABSTRACT

There is provided a printed circuit board (PCB) comprising a first ground layer extended in one direction; a first dielectric layer laminated on the first ground layer and extended in the same direction of the first ground layer; a signal transmission line laminated on the first dielectric layer and extended in the same direction of the first dielectric layer; a first bonding sheet disposed above the first dielectric layer; a second bonding sheet disposed above the first dielectric layer; a second dielectric layer disposed above the signal transmission line, the first bonding sheet, and the second bonding sheet; and a second ground layer laminated on the second dielectric layer.

18 Claims, 7 Drawing Sheets

PRINTED CIRCUIT BOARD REMOVING BONDING SHEET AROUND SIGNAL TRANSMISSION LINE

CROSS-REFERENCE TO RELATED APPLICATIONS

This application is a national phase application of PCT Application No. PCT/KR2008/006910 filed on Nov. 21, 2008, which claims the benefit and priority to Korean Patent Application No. 10-2008-0035949 filed Apr. 18, 2008. The entire disclosures of the applications identified in this paragraph are incorporated herein by references.

TECHNICAL FIELD

The present invention relates to a printed circuit board (PCB), and more particularly, to a PCB from which bonding sheet parts around a signal transmission line are removed.

BACKGROUND ART

An internal circuit of wireless communication devices is generally mounted on a printed circuit board (PCB). Such PCB technologies have been notably developed, and now, there are widely used not only conventional hard PCBs but also flexible PCB (FPCB) capable of freely moving.

DETAILED DESCRIPTION OF THE INVENTION

[Technical Problem]

The present invention provides a printed circuit board (PCB) where bonding sheet parts around a signal transmission line are removed.

[Technical Solution]

According to an aspect of the present invention, there is provided a printed circuit board (PCB) including: a first ground layer extended in one direction; a first dielectric layer laminated on the first ground layer and extended in the same direction of the first ground layer; a signal transmission line laminated on the first dielectric layer and extended in the same direction of the first dielectric layer; a first bonding sheet disposed above the first dielectric layer, separated from the signal transmission line at a predetermined interval on one side thereof, and extended in the same direction of the signal transmission line; a second bonding sheet disposed above the first dielectric layer, separated from the signal transmission line at a predetermined interval on another side thereof, and extended in the same direction of the signal transmission line; a second dielectric layer disposed above the signal transmission line, the first bonding sheet, and the second bonding sheet; and a second ground layer laminated on the second dielectric layer, wherein the first and second bonding sheets bond the first dielectric layer to the second dielectric layer.

A height of one of the first bonding sheet and the second bonding sheet may be variable. The height of one of the first bonding sheet and the second bonding sheet may be greater than that of the signal transmission line.

The PCB may further include: a third bonding sheet disposed on the first bonding sheet and bonding the first bonding sheet to the second dielectric layer; and a fourth bonding sheet disposed on the second bonding sheet and bonding the second bonding sheet to the second dielectric layer. The PCB may further include: one or more fifth bonding sheets sequentially laminated on the third bonding sheet; and one or more sixth bonding sheets sequentially laminated on the fourth bonding sheet. The PCB may further include: a first insulating layer disposed between the first bonding sheet and the third bonding sheet; and a second insulating layer disposed between the second bonding sheet and the fourth bonding sheet. The first insulating layer and the second insulating layer may include a plurality of insulating layer patterns formed by boring one of the first insulating layer and the second insulating layer with a predetermined interval in one or more lines in a longitudinal direction of one of the first insulating layer and the second insulating layer. The first bonding sheet and the second bonding sheet may include a plurality of bonding sheet patterns formed by boring one of the first to bonding sheet and the second bonding sheet with a predetermined interval in one or more lines in a longitudinal direction of one of the first bonding sheet and the second bonding sheet. The first bonding sheet and the second bonding sheet may be connected to each other one or more parts. The PCB may further include a cover layer covering tops of the first dielectric layer and the signal transmission line, wherein the first bonding sheet and the second bonding sheet are disposed on the cover layer.

According to another aspect of the present invention, there is provided a PCB including: a first ground layer extended in one direction; a first dielectric layer laminated on the first ground layer and extended in the same direction of the first ground layer; a signal transmission line laminated on the first dielectric layer and extended in the same direction of the first dielectric layer; a bonding sheet disposed above the signal transmission line and extended in the same direction of the signal transmission line; a second dielectric layer disposed above the signal transmission line and the bonding sheet; and a second ground layer laminated on the second dielectric layer, wherein the bonding sheet includes a plurality of patterns formed by boring the bonding sheet with a predetermined interval in one or more lines in a longitudinal direction of the bonding sheet. The PCB may further include a cover layer covering tops of the first dielectric layer and the signal transmission line, wherein the bonding sheet is disposed on the cover layer.

According to still another aspect of the present invention, there is provided a PCB including: a first ground layer extended in one direction; a first dielectric layer laminated on the first ground layer and extended in the same direction of the first ground layer; a first bonding sheet and a second bonding sheet disposed on both edges of the first dielectric layer in a longitudinal direction thereof, respectively; a to second dielectric layer disposed above the first bonding sheet and the second bonding sheet; a signal transmission line formed on one of a bottom and a top of the second dielectric layer and extended in the same direction of the second dielectric layer; a third bonding sheet and a fourth bonding sheet disposed on both edges of the second dielectric layer in a longitudinal direction thereof, respectively; a third dielectric layer disposed above the third bonding sheet and the fourth bonding sheet; and a second ground layer laminated on the third dielectric layer and extended in the same direction of the third dielectric layer.

The signal transmission line may be separated from one pair of the first and second bonding sheets and the third and fourth bonding sheets at a predetermined distance in a horizontal direction. The height of the signal transmission line may be smaller than that of the first to fourth bonding sheets. The first bonding sheet and the second bonding sheet may be connected to each other at one or more parts or the third bonding sheet and the fourth bonding sheet may be connected to each other at one or more parts. One or more of the first bonding sheet, the second bonding sheet, the third bonding sheet, and the fourth bonding sheet may include a plurality of bonding sheet patterns formed by boring the one or more of the first to fourth bonding sheets with a predetermined interval in one or more lines in a longitudinal direction of the first to fourth bonding sheets.

The first bonding sheet and the second bonding sheet may be manufactured as a single body to have a panel-like shape or the third bonding sheet and the fourth bonding sheet may be manufactured as a single body to have a panel-like shape. The PCB may be a flexible PCB.

[ADVANTAGEOUS EFFECTS]

A printed circuit board according to an embodiment of the present invention has advantages such as reducing a loss of electrical efficiency and increasing a width of a signal transmission line by removing bonding sheet parts around the signal transmission line.

BEST MODE FOR CARRYING OUT THE INVENTION

Figure 1:
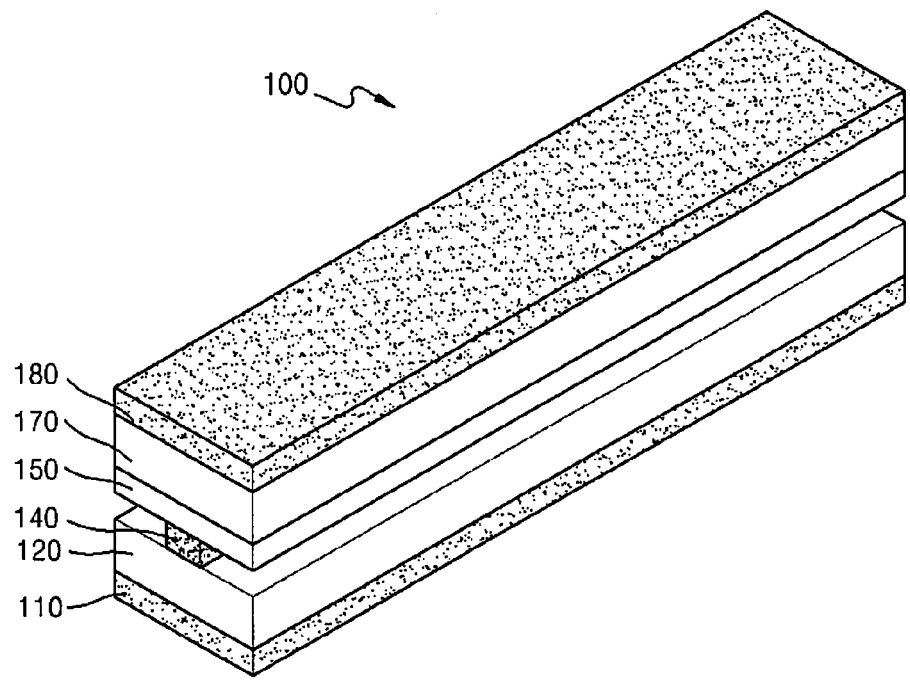
FIG. 1 is a perspective view illustrating a printed circuit board (PCB) having a micro strip line structure.

To fully understand advantages of operations of the present invention and the objects obtained by embodiments of the present invention, it is required to refer to attached drawings illustrating preferable embodiments of the present invention and contents shown in the drawings. Hereinafter, the preferable embodiments of the present invention will be described in detail with reference to the attached drawings. The same reference numerals shown in each drawing indicate the same elements.

A printed circuit board (PCB) disclosed in the detailed description may be a general PCB or a flexible PCB (FPCB).

Figure 2:
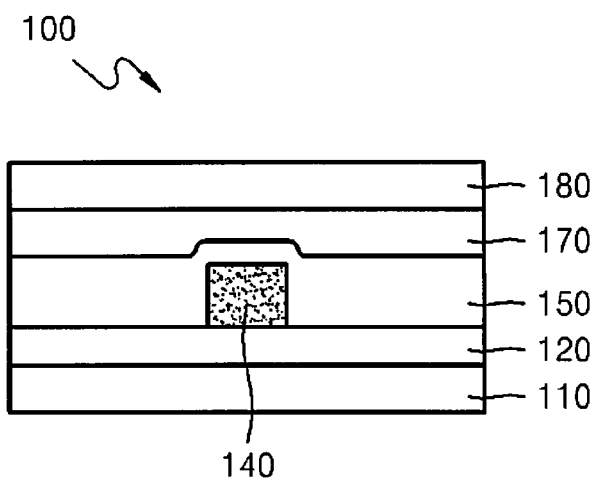
FIG. 2 is a side view illustrating the PCB of FIG. 1.

FIG. 1 is a perspective view illustrating a PCB 100 having a micro strip line structure. FIG. 2 is a side view illustrating the PCB 100. Referring to FIGS. 1 and 2, the PCB 100 includes a first ground layer 110, a first dielectric layer 120, a signal transmission line 140, a bonding sheet 150, a second dielectric layer 170, and a second ground layer 180. The first ground layer 110, the first dielectric layer 120, the signal transmission line 140, the second dielectric layer 170, and the second ground layer 180 are sequentially laminated and extended in the same direction. The first ground layer 110 and the second ground layer 180 are formed of a metallic material such as copper and connected to a ground. The first dielectric layer 120 and the second dielectric layer 170 are formed of a dielectric material such as polyimide. The signal transmission line 140 is formed of a metallic material such as copper. The bonding sheet 150 bonds the second dielectric layer 170 and the second ground layer 180 to the signal transmission line 140. Referring to FIG. 2, the bonding sheet 150 is coupled with the signal transmission line 140 in a form of covering the signal transmission line 140.

Figure 3:
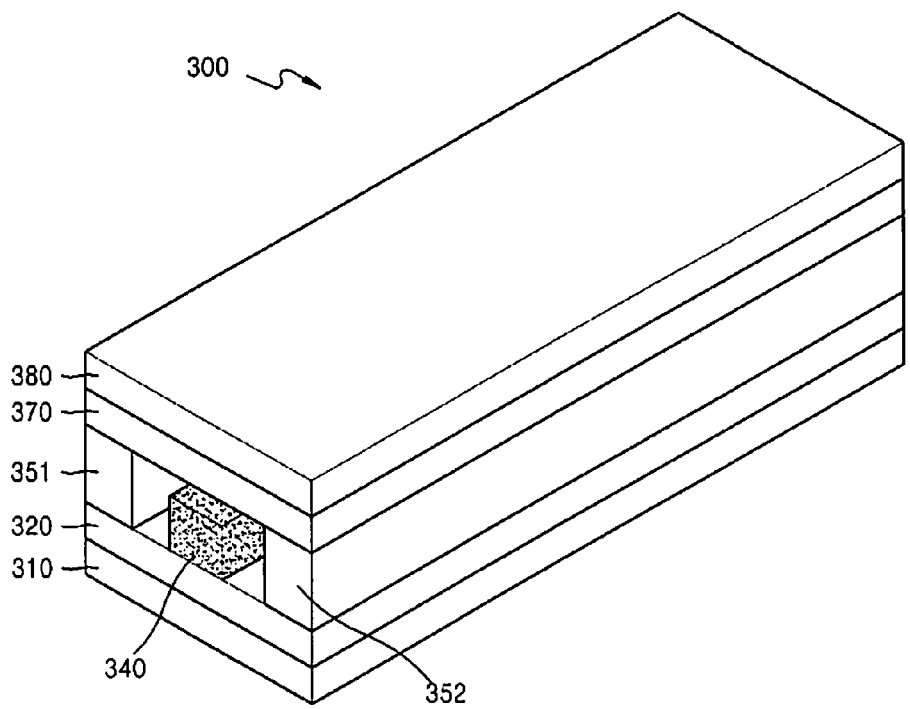
FIG. 3 is a perspective view illustrating a PCB according to an embodiment of the present invention.
Figure 4:
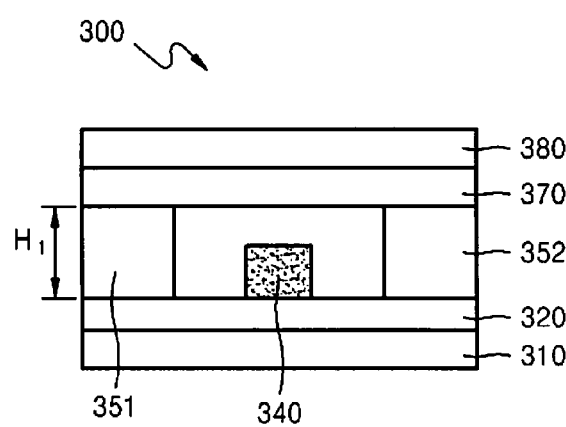
FIG. 4 is a side view illustrating the PCB of FIG. 3.

FIG. 3 is a perspective view illustrating a PCB 300 according to an embodiment of the present invention. FIG. 4 is a side view illustrating the PCB 300. Referring to FIGS. 3 and 4, the PCB 300 includes a first ground layer 310, a first dielectric layer 320, a signal transmission line 340, a first bonding sheet 351, a second bonding sheet 352, a second dielectric layer 370, and a second ground layer 380. The first ground layer 310, the first dielectric layer 320, and the signal transmission line 340 are sequentially laminated and extended in the same direction.

The first bonding sheet 351 and the second bonding sheet 352 bond the first dielectric layer 320 to the second dielectric layer 370. The first bonding sheet 351 and the second bonding sheet 352 are extended in the same direction of the signal transmission line 340 and disposed on the first dielectric layer 320 together with the signal transmission line 340. The first bonding sheet 351 and the second bonding sheet 352 are disposed on both sides of the signal transmission line 340 with a predetermined interval therebetween. That is, in the case of the PCB 300, different from the PCB 100 of FIG. 2, a part of the bonding sheet 150, adjacent to the signal transmission line 140, is removed.

The second dielectric layer 370 and the second ground layer 380 are sequentially laminated on the signal transmission line 340, the first bonding sheet 351 and the second bonding sheet 352 and extended in the same direction of the signal transmission line 340, the first bonding sheet 351 and the second bonding sheet 352. Since bonding two layers to each other, a bonding sheet is formed of a material having a high dielectric constant. In the case of the PCB 100 shown in FIGS. 1 and 2, since the bonding sheet 150 covers the signal transmission line 140, the bonding sheet 150 with a high dielectric constant is located around the signal transmission line 140. Accordingly, a capacitance around the signal transmission line 140 is increased. On the other hand, a loss occurring while transmitting a signal is in proportion to the capacitance around the signal transmission line 140, the PCB 100 shown in FIGS. 1 and 2 has a great loss while transmitting a signal. On the other hand, in the case of the PCB 300, there is no bonding sheet with a high dielectric constant around the signal transmission line 340. Accordingly, a capacitance around the signal transmission line 340 is decreased, thereby decreasing a loss occurring while transmitting a signal in the PCB 300.

Also, in the case of the PCB 300, there exists an interval between the signal transmission line 340 and the first bonding sheet 351 and there exists an interval between the signal transmission line 340 and the second bonding sheet 352. Accordingly, it is possible to increase a width of the signal transmission line 340. On the other hand, though the first bonding sheet 351 and the second bonding sheet 352 are shown as separated from each other in every part in FIG. 3, the first bonding sheet 351 and the second bonding sheet 352 may be connected to each other one or more parts. For example, at one end, both ends, or a center in a longitudinal direction of the PCB 300, the first bonding sheet 351 and the second bonding sheet 352 may be connected to each other.

Figure 5:
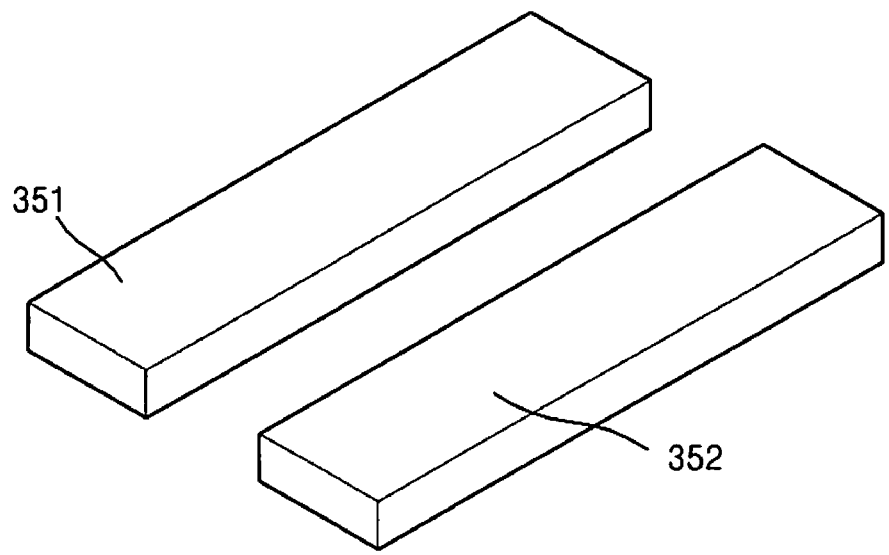
FIG. 5 is a view illustrating bonding sheets according to an embodiment of the present invention.

FIG. 5 is a view illustrating the bonding sheets 351 and 352. In FIG. 5, there are shown the first bonding sheet 351 and the second bonding sheet 352 separated from each other. The signal transmission line 340 may be disposed between the first bonding sheet 351 and the second bonding sheet 352. Referring to FIG. 4, the signal transmission line 340 is laminated on the first dielectric layer 320 and the first bonding sheet 351 and the second bonding sheet 352 shown in FIG. 5 are disposed on both sides of the signal transmission line 340 with the predetermined interval therebetween. Then, the second dielectric layer 370 is disposed above the first bonding sheet 351 and the second bonding sheet 352.

Figure 6:
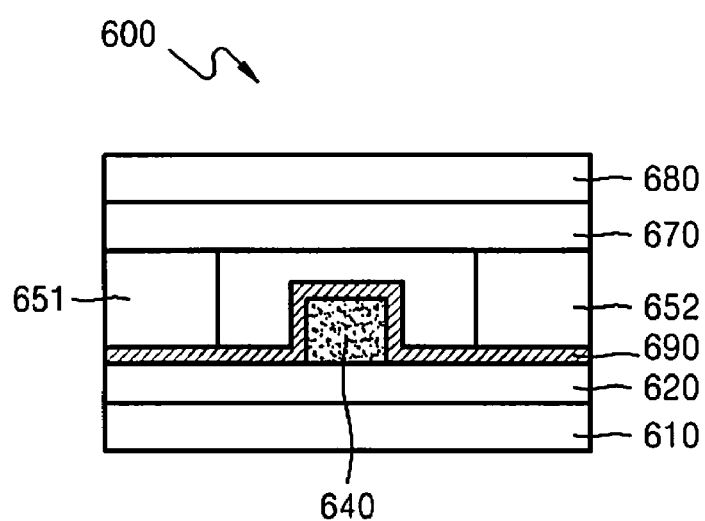
FIG. 6 is a view illustrating a PCB further including a cover layer, different from the PCB of FIG. 3.

FIG. 6 is a view illustrating a PCB 600 further including a cover layer 690, different from the PCB 300 shown in FIGS. 3 and 4. Referring to FIG. 6, the PCB 600 may further include the cover layer 690. The cover layer 690 covers tops of a first dielectric layer 620 and a signal transmission line 640. A first bonding sheet 651 and a second bonding sheet 652 are disposed on the cover layer 690. On the other hand, other PCBs disclosed in the detailed description may further include a cover layer similar to the cover layer 690 shown in FIG. 6. Since it is possible to recognize a form of a cover layer included in other PCBs disclosed in the detailed description to those skilled in the art, a detailed description on the form will be omitted.

Figure 7:
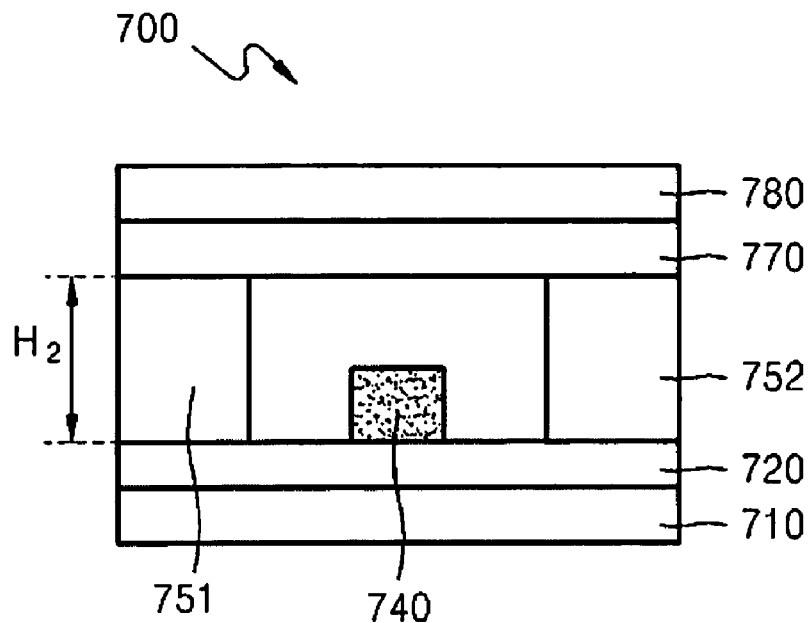
FIG. 7 is a side view illustrating a PCB according to another embodiment of the present invention.

FIG. 7 is a side view illustrating a PCB 700 according to another embodiment of the present invention. With respect to the PCB 700 shown in FIG. 7, differences from the PCB 300 shown in FIGS. 3 and 4 will be described in priority. Referring to FIGS. 4 and 7, a height H2 of a first bonding sheet 751 and a to second bonding sheet 752 of the PCB 700 is greater than that of the first bonding sheet 351 and the second bonding sheet 352 of the PCB 300. Accordingly, a distance between a signal transmission line 740 and a second ground layer 780 becomes increased, thereby more reducing a capacitance around the signal transmission line 740. Also, since a space between the signal transmission line 740 and the second ground layer 780 is filled with air whose dielectric constant is very low, the capacitance around the signal transmission line 740 becomes more reduced. Accordingly, the PCB 700 may reduce a loss occurring while transmitting a signal.

Figure 8:
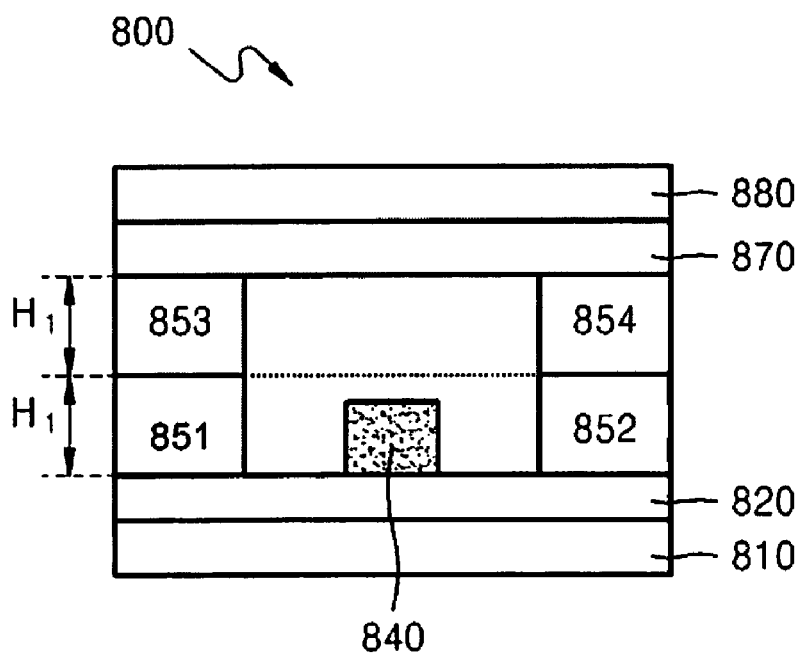
FIG. 8 is a side view illustrating a PCB according to still another embodiment of the present invention.

FIG. 8 is a side view illustrating a PCB 800 according to still another embodiment of the present invention. With respect to the PCB 800 shown in FIG. 8, differences from the PCB 300 shown in FIGS. 3 and 4 will be described in priority. Referring to FIG. 8, in the case of the PCB 800, bonding sheets 851, 852, 853, and 854 are laminated in a two-storied form. In detail, the PCB 800 includes first to fourth bonding sheets 851, 852, 853, and 854. The third bonding sheet 853 is disposed on a top of the first bonding sheet 851 and bonds the first bonding sheet 851 to a second dielectric layer 870. The fourth bonding sheet 854 is disposed on a top of the second bonding sheet 852 and bonds the second bonding sheet 852 to the second dielectric layer 870. That is, in the case of the PCB 300, the bonding sheets 351 and 352 are disposed as a single deck. On the other s hand, in the case of the PCB 800, the third and fourth bonding sheets 853 and 854 are additionally laminated on the first and second bonding sheets 851 and 852. Accordingly, since a distance between a signal transmission line 840 and a second ground layer 880 becomes increased and a space therebetween is filled with air whose dielectric constant is very low, a capacitance around the signal transmission line 840 may be more reduced.

On the other hand, though heights H1 of the first to fourth bonding sheets 851, 852, 853, and 854 are shown as the same in FIG. 8, the heights H1 may be different from one another. For example, the height of the first and second bonding sheets 851 and 852 disposed below may be different from that of the third and fourth bonding sheets 853 and 854. Also, within a range where a sum of the heights of the bonding sheets 851 and 853 disposed on one side is identical to a sum of the heights of the bonding sheets 852 and 854 disposed on another side, the heights of the bonding sheets 851, 852, 853, and 854 may be variable. Also, though the bonding sheets 851, 852, 853, and 854 are laminated in a two-storied form in FIG. 8, bonding sheets may be laminated in a three-storied form. For example, the PCB 800 may further include one or more fifth bonding sheets (not shown) and one or more sixth bonding sheets (not shown). The one or more fifth bonding sheets may be sequentially laminated on the third bonding sheet 853, and the one or more sixth bonding sheets may be sequentially laminated on the fourth bonding sheet 854.

Figure 9:
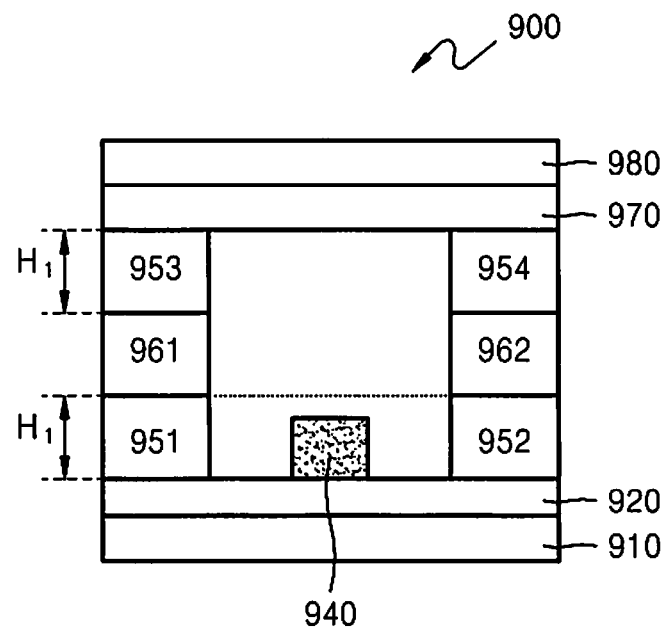
FIG. 9 is a side view illustrating a PCB according to yet another embodiment of the present invention.

FIG. 9 is a side view illustrating a PCB 900 according to yet another embodiment of the present invention. With respect to the PCB 900 shown in FIG. 9, differences from the PCB 800 shown in FIG. 8 will be described in priority. Referring to FIGS. 8 and 9, different from the PCB 800, the PCB 900 further includes a first insulating layer 961 formed between bonding sheets 951 and 953 and a second insulating layer 962 formed between bonding sheets 952 and 954. The first insulating layer 961 is disposed between a first bonding sheet 951 and a third bonding sheet 953, and the second insulating layer 962 is disposed between a second bonding sheet 952 and a fourth bonding sheet 954. The first bonding sheet 951 bonds a first dielectric layer 920 to the first insulating layer 961, and the third bonding sheet 953 bonds the first dielectric layer 920 to a second dielectric layer 970. Also, the second bonding sheet 952 bonds the first dielectric layer 920 to the second insulating layer 962, and the fourth bonding sheet 954 bonds the second insulating layer 962 to the second dielectric layer 970.

Since the PCB 900 further includes the first and second insulating layers 961 and 962, different from the PCB 800 shown in FIG. 8, a distance between a signal transmission line 940 and a second ground layer 980 becomes increased and a space therebetween is filled with air whose dielectric constant is very low, thereby more reducing a capacitance around the signal transmission line 940. Heights of the first and second insulating layers 961 and 962 may be variable. That is, the heights of the first and second insulating layers 961 and 962 may be smaller or greater than heights H1 of the bonding sheets 951, 952, 953, and 954 or identical thereto. Also, other insulating layers (not shown) are additionally laminated above the first and second insulating layers 961 and 962, thereby more increasing the distance between the signal transmission line 940 and the second ground layer 980.

Figure 10:
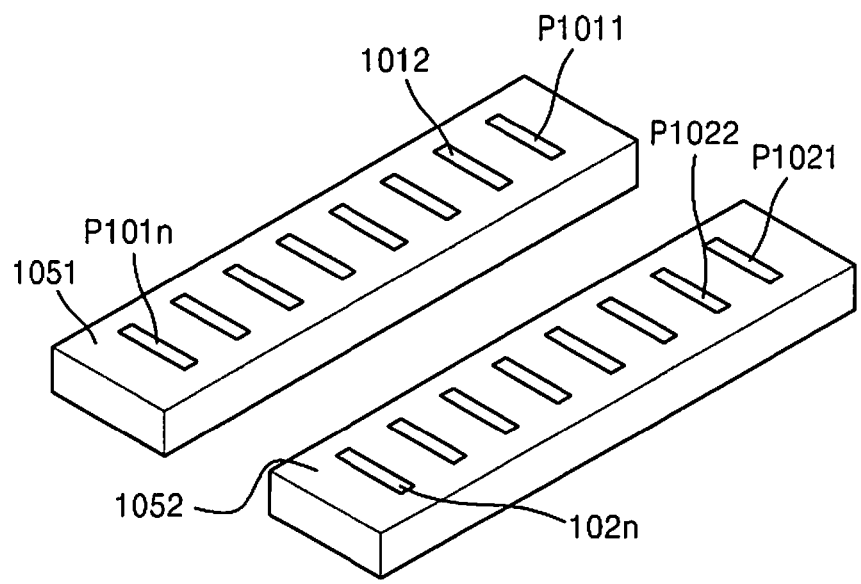
FIG. 10 is a view illustrating bonding sheets according to another embodiment of the present invention.

FIG. 10 is a view illustrating bonding sheets 1051 and 1052 according to another embodiment of the present invention. Referring to FIG. 10, on the bonding sheets 1051 and 1052, a plurality of bonding sheet patterns P1011, P1012, ..., P101n, P1021, P1022, ..., and P102n are formed. The bonding sheet patterns P1011, P1012, ..., P101n, P1021, P1022, ..., and P102n are formed by boring the first bonding sheet 1051 and the second bonding sheet 1052 and arranged in a longitudinal direction of the first bonding sheet 1051 and second bonding sheet 1052 at a predetermined interval in a line. On the other hand, on Jo the bonding sheets 351 and 352 shown in FIG. 5, there is no bonding sheet patterns shown in FIG. 10. That is, depending on embodiments, bonding sheet patterns may be formed or not. Flexibility of the bonding sheets 1051 and 1052 may be improved due to the bonding sheet patterns P1011, P1012, ..., P101n, P1021, P1022, ..., and P102n. Also, since a part of the bonding sheets 1051 and is 1052 are bored to form the bonding sheet patterns P1011, P1012, ..., P101n, P1021, P1022, . . . , and P102n, a dielectric constant may be reduced as much as bored, thereby reducing a capacitance around a signal transmission line (not shown) disposed between the bonding sheets 1051 and 1052.

The shape of the bonding sheet patterns P1011, P1012, . . . , P101n, P1021, P1022, . . . , and P102n may be as shown in FIG. 10 but not limited thereto. Since it is possible to form bonding sheet patterns having a shape different from that shown in FIG. 10 with reference to the detailed description to those skilled in the art, a detailed description on various shapes of bonding sheet patterns will be omitted.

Though the bonding sheet patterns P1011, P1012, . . . , P101n, P1021, P1022, . . . , and P102n are arranged in a line in FIG. 10, other bonding sheet patterns (not shown) may be arranged next to the bonding sheet patterns P1011, P1012, P101n, P1021, P1022, . . . , and P102n arranged in a line. That is, bonding sheet patterns may be arranged in tow or more lines in the longitudinal direction of the first bonding sheet 1051 and the second bonding sheet 1052.

Among bonding sheets shown in FIGS. 4, 6, 7, 8, and 9, on some of the bonding sheets, the bonding sheet patterns P1011, P1012, . . . , P101n, P1021, P1022, . . . , and P102n shown in FIG. 10 may be formed and there may be not formed bonding sheet patterns on other bonding sheet. That is, in one PCB, the bonding sheets 1051 and 1052 shown in FIG. 10 coexist with the bonding sheets 351 and 352 shown in FIG. 5. On the other hand, on the first and second insulating layers 961 and 962 shown in FIG. 9, insulating layer patterns (not shown) may be formed and arranged in a form similar to that of the bonding sheet patterns P1011, P1012, . . . , P101n, P1021, P1022, . . . , and P102n shown in FIG. 10. Only, depending on embodiments, insulating layer patterns may be formed or not on the first and second insulating layers 961 and 962.

Figure 11:
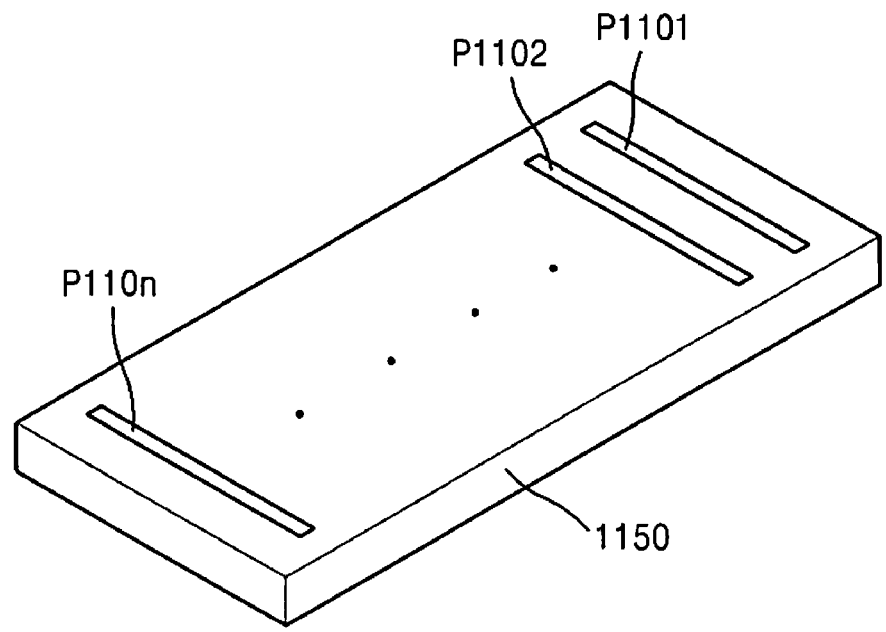
FIG. 11 is a view illustrating a bonding sheet according to still another embodiment of the present invention.

FIG. 11 is a view illustrating a bonding sheet 1150 according to still another embodiment of the present invention. Referring to FIG. 11, the bonding sheet 1150 is formed of one piece, different from the bonding sheets 351, 352, 1051, and 1052 shown in FIGS. 5 and 10, which are formed of two pieces. The bonding sheet 1150 may replace the bonding sheet 150 shown in FIGS. 1 and 2.

Referring to FIG. 11, on the bonding sheet 1150, a plurality of bonding sheet patterns P1101, P1102, . . . , and P110n are formed. The bonding sheet patterns P1101, P1102, . . . , and P110n are formed by boring the bonding sheet 1150 and arranged in a longitudinal direction of the bonding sheet 1150 at a predetermined interval in a line. Flexibility of the bonding sheet 1150 may be improved due to the bonding sheet patterns P1101, P1102, . . . , and P110n.

Figure 12:
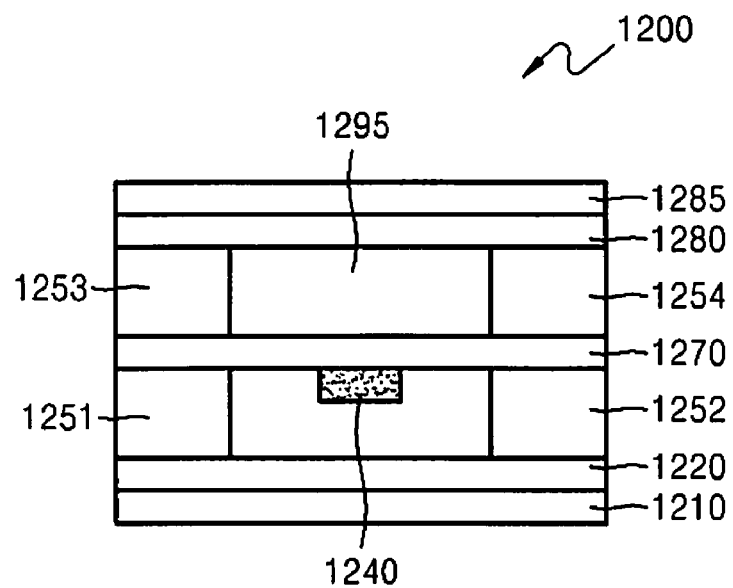
FIG. 12 is a side view illustrating a PCB according to a further embodiment of the present invention.

FIG. 12 is a side view illustrating a PCB 1200 according to a further embodiment of the present invention. Referring to FIG. 12, the PCB 1200 includes a first ground layer 1210, a first dielectric layer 1220, a first bonding sheet 1251, a second bonding sheet 1252, a second dielectric layer 1270, a signal transmission line 1240, a third bonding sheet 1253, a fourth bonding sheet 1254, a third dielectric layer 1280, and a second ground layer 1285.

Elements of the PCB 1200 are extended in the same direction and sequentially laminated. In detail, the first dielectric layer 1220 is laminated on the first ground layer 1210 and extended in the same direction of the first ground layer 1210. The first bonding sheet 1251 and the second bonding sheet 1252 are disposed on both ends in a longitudinal direction of the first dielectric layer 1220, respectively. The second dielectric layer 1270 is disposed above the first bonding sheet 1251 and the second bonding sheet 1252. The first bonding sheet 1251 and the second bonding sheet 1252 bond the first dielectric layer 1220 to the second dielectric layer 1270. The signal transmission line 1240 may be formed on a bottom of the second dielectric layer 1270. The third bonding sheet 1253 and the fourth bonding sheet 1254 are disposed on both ends in a longitudinal direction of the second dielectric layer 1280, respectively. The third dielectric layer 1280 is disposed above the third bonding sheet 1253 and the fourth bonding sheet 1254. The third bonding sheet 1253 and the fourth bonding sheet 1254 bond the second dielectric layer 1270 to the third dielectric layer 1280. The second ground layer 1285 is laminated on the third dielectric layer 1280 and extended in the same direction of the third dielectric layer 1280.

A width in a lateral direction of the signal transmission line 1240 is shorter than that of the second dielectric layer 1270. After forming a signal transmission line material on the second dielectric layer 1270, both edges of the signal transmission line material are etched, thereby forming the signal transmission line 1240. The signal transmission line 1240 may be separated from the first bonding sheet 1251 and the second bonding sheet 1252 at a predetermined distance in a horizontal direction. A vertical length of the signal transmission line 1240 may be shorter than that of the first bonding sheet 1251 and the second bonding sheet 1252. An air layer 1295 may exist between a top surface of the second dielectric o layer 1270, where a signal transmission line is not formed, and the third dielectric layer 1280.

Though the signal transmission line 1240 is formed on the bottom of the second dielectric layer 1270 in FIG. 12, the signal transmission line 1240 may be formed on a top surface of the second dielectric layer 1270.

Figure 13:
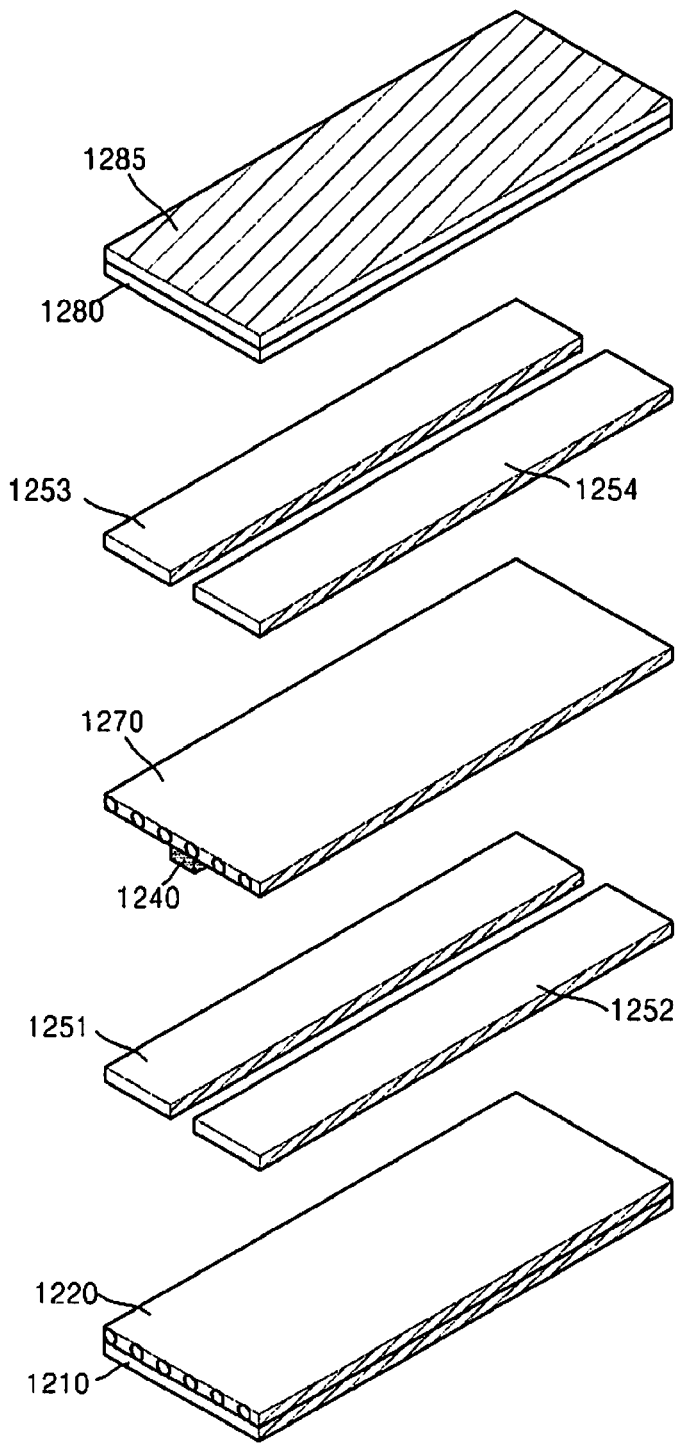
FIG. 13 is a perspective view illustrating raw materials with one surface and bonding sheets, which are capable of embodying the PCB of FIG. 12.

FIG. 13 is a perspective view illustrating raw materials with one surface and bonding sheets, which are capable of forming the PCB 1200 shown in FIG. 12. Referring to FIG. 13, the PCB 1200 shown in FIG. 12 may be embodied using three pieces of raw materials with one surface. First raw materials 1210 and 1220 with one surface may form the first ground layer 1210 and the first dielectric layer 1120. Second raw materials 1240 and 1270 with one surface may form the signal transmission line 1240 and the second dielectric layer 1270. Third raw materials 1280 and 1285 with one surface may form the third dielectric layer 1280 and the second ground layer 1285. The first bonding sheet 1251 and the second bonding sheet 1252 may be disposed between the first raw materials 1210 and 1220 and the second raw materials 1240 and 1270, and the third bonding sheet 1253 and the fourth bonding sheet 1254 may be disposed between the second raw materials 1240 and 1270 and the third raw materials 1280 and 1285. Though the first bonding sheet 1251 and the second bonding sheet 1252 are separated at every part in FIGS. 12 and 13, the first bonding sheet 1251 and the second bonding sheet 1252 may be connected to each other at one or more parts. For example, on one of one end, both ends, and a center in a longitudinal direction of the PCB 1200, the first bonding sheet 1251 and the second bonding sheet 1252 may be connected to each other. The third bonding sheet 1253 and the fourth bonding sheet 1254 are similar thereto. As the bonding sheets 1051 and 1052 shown in FIG. 10, bonding sheet patterns may be formed on the first bonding sheet 1251, the second bonding sheet 1252, the third bonding sheet 1253, and the fourth bonding sheet 1254.

In FIGS. 12 and 13, the first bonding sheet 1251 and the second bonding sheet 1252 are formed of two pieces. However, as shown in FIG. 11, a bonding sheet formed of one piece may replace the first bonding sheet 1251 and the second bonding sheet 1252. Also, the bonding sheet formed of one piece may replace the third bonding sheet 1253 and the fourth bonding sheet 1254. Both of first and second bonding sheets 1251 and 1252 and the third and fourth bonding sheets 1253 and 1254 may be replaced by the bonding sheet formed of one piece, or one of them may be replaced by the bonding sheet formed of one piece. That is, the first bonding sheet 1251 and the second bonding sheet 1252 may be manufactured as a single body to have a panel-like shape. The third bonding sheet 1253 and the fourth bonding sheet 1254 may be manufactured as a single body to have a panel-like shape. Also, on the bonding sheet formed of one piece, patterns shown in FIG. 11 may be formed or not.

While the present invention has been particularly shown and described with reference to exemplary embodiments thereof, it will be understood by those of ordinary skill in the art that various changes in form and details may be made therein without departing from the spirit and scope of the present invention as defined by the following claims.

[Industrial Applicability]

The present invention may be applied to the field of manufacturing printed circuit boards.

The invention claimed is:

1. A printed circuit board (PCB) comprising:
a first ground layer extended in one direction;
a first dielectric layer laminated on the first ground layer and extended in the same direction of the first ground layer;
a signal transmission line laminated on a top of the first dielectric layer and extended in the same direction of the first dielectric layer;
a first bonding sheet disposed above the first dielectric layer, separated from the signal transmission line at a predetermined interval on one side thereof, and extended in the same direction of the signal transmission line;
a second bonding sheet disposed above the first dielectric layer, separated from the signal transmission line at a predetermined interval on another side thereof, and extended in the same direction of the signal transmission line;
a third bonding sheet disposed on the first bonding sheet and bonding the first bonding sheet to the second dielectric layer;
a fourth bonding sheet disposed on the second bonding sheet and bonding the second bonding sheet to the second dielectric layer;
a second dielectric layer disposed above the signal transmission line, the first bonding sheet, and the second bonding sheet; and
a second ground layer laminated on the second dielectric layer,
wherein the first and second bonding sheets are disposed on edges of the first dielectric layer along the signal transmission line and bond the first dielectric layer to the second dielectric layer.

2. The PCB of claim 1, wherein a height of the first bonding sheet or the second bonding sheet is greater than that of the signal transmission line.

3. The PCB of claim 1, further comprising:
one or more fifth bonding sheets sequentially laminated on the third bonding sheet; and
one or more sixth bonding sheets sequentially laminated on the fourth bonding sheet.

4. The PCB of claim 1, further comprising:
a first insulating layer disposed between the first bonding sheet and the third bonding sheet; and
a second insulating layer disposed between the second bonding sheet and the fourth bonding sheet.

5. The PCB of claim 4, wherein the first insulating layer and the second insulating layer comprise a plurality of insulating layer patterns formed by boring one of the first insulating layer and the second insulating layer with a predetermined interval in one or more lines in a longitudinal direction of one of the first insulating layer and the second insulating layer.

6. The PCB of claim 1, wherein the first bonding sheet and the second bonding sheet comprise a plurality of bonding sheet patterns formed by boring one of the first bonding sheet and the second bonding sheet with a predetermined interval in one or more lines in a longitudinal direction of one of the first bonding sheet and the second bonding sheet.

7. The PCB according to claim 1, further comprising a cover layer covering tops of the first dielectric layer and the signal transmission line,
wherein the first bonding sheet and the second bonding sheet are disposed on the cover layer.

8. The PCB according to claim 1, which is a flexible PCB.

9. A PCB comprising:
a first ground layer extended in one direction;
a first dielectric layer laminated on the first ground layer and extended in the same direction of the first ground layer;
a signal transmission line laminated on the first dielectric layer and extended in the same direction of the first dielectric layer;
a bonding sheet disposed above the signal transmission line and extended in the same direction of the signal transmission line;
a second dielectric layer disposed above the signal transmission line and the bonding sheet; and
a second ground layer laminated on the second dielectric layer,
wherein the bonding sheet comprises a plurality of patterns formed by boring the bonding sheet with a predetermined interval in one or more lines in a longitudinal direction of the bonding sheet.

10. The PCB of claim 9, further comprising a cover layer covering tops of the first dielectric layer and the signal transmission line,
wherein the bonding sheet is disposed on the cover layer.

11. The PCB according to claim 9, which is a flexible PCB.

12. A PCB comprising:
a first ground layer extended in one direction;
a first dielectric layer laminated on the first ground layer and extended in the same direction of the first ground layer;
a first bonding sheet and a second bonding sheet disposed on both edges of the first dielectric layer in a longitudinal direction thereof, respectively;
a second dielectric layer disposed above the first bonding sheet and the second bonding sheet;
a signal transmission line formed on one of a bottom and a top of the second dielectric layer and extended in the same direction of the second dielectric layer;
a third bonding sheet and a fourth bonding sheet disposed on both edges of the second dielectric layer in a longitudinal direction thereof, respectively;
a third dielectric layer disposed above the third bonding sheet and the fourth bonding sheet; and
a second ground layer laminated on the third dielectric layer and extended in the same direction of the third dielectric layer.

13. The PCB of claim 12, wherein the signal transmission line is separated from one pair of the first and second bonding sheets and the third and fourth bonding sheets at a predetermined distance in a horizontal direction.

14. The PCB of claim 12, wherein a height of the signal transmission line is smaller than that of the first to fourth bonding sheets.

15. The PCB of claim 12, wherein the first bonding sheet and the second bonding sheet are connected to each other at one or more parts or the third bonding sheet and the fourth bonding sheet are connected to each other at one or more parts.

16. The PCB of claim 12, wherein one or more of the first bonding sheet, the second bonding sheet, the third bonding sheet, and the fourth bonding sheet comprise a plurality of bonding sheet patterns formed by boring the one or more of the first to fourth bonding sheets with a predetermined interval in one or more lines in a longitudinal direction of the first to fourth bonding sheets.

17. The PCB of claim 12, wherein the first bonding sheet and the second bonding sheet are manufactured as a single body to have a panel-like shape or the third bonding sheet and the fourth bonding sheet are manufactured as a single body to have a panel-like shape.

18. The PCB according to claim 12, which is a flexible PCB.

* * * * *